: 
United States Patent [19]

Tokumine et al.

[11] Patent Number: 5,995,097
[45] Date of Patent: *Nov. 30, 1999

[54] METHOD AND APPARATUS FOR CONFIRMING MATCHING OF DATA IN A DISTRIBUTED PROCESSING SYSTEM

[75] Inventors: Shinichi Tokumine; Kazuyuki Ujiie, both of Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/445,685

[22] Filed: May 22, 1995

[30] Foreign Application Priority Data

Aug. 19, 1994 [JP] Japan ................................. 6-195334

[51] Int. Cl.⁶ ........................................... G06F 17/50
[52] U.S. Cl. .................... 345/331; 345/964; 707/201; 707/203; 709/204
[58] Field of Search .................................. 395/608, 617, 395/618, 619, 331, 329, 200.01, 200.04, 200.03, 200.34; 707/8, 201, 202, 203; 345/329, 331, 964

[56] References Cited

U.S. PATENT DOCUMENTS

| 4,809,170 | 2/1989 | Leblang et al. ................... 364/DIG. 1 |
| 5,333,316 | 7/1994 | Champagne et al. ........................ 707/8 |
| 5,339,247 | 8/1994 | Kirihara et al. ................... 364/468.13 |
| 5,418,728 | 5/1995 | Yada ................................. 364/468.03 |
| 5,499,367 | 3/1996 | Bamford et al. ............................ 707/8 |
| 5,526,517 | 6/1996 | Jones et al. .............................. 395/608 |

OTHER PUBLICATIONS

Allen et al., "Distributed Methodology Management for Design–in–the–Large", Computer–Aided Design, 1990 International Conference, p. 346–49.
De Micheli, "Extending CAD Tools and Techniques", Computer Magazine, pp. 85–87, Jan. 1993.
Sriram et al., "The MIT Dice Project", Computer Magazine, pp. 64–65, Jan. 1993.

*Primary Examiner*—Alyssa H. Bowler
*Assistant Examiner*—Walter D. Davis, Jr.
*Attorney, Agent, or Firm*—Staas & Halsey

[57] ABSTRACT

A method and an apparatus for confirming matching of data in a distributed processing system aiming easy maintenance of the matching of the data and efficient parallel design work in a distributed processing system. In the distributed processing system having a server including a database and plural clients utilizing data in the database, said server and clients are connected to each other. The server stores information of destinations to which data in the database has been distributed and receives information of an editorial history of the data from a client that is a destination of the distributed data to store the editorial history information at the destination client on the side of the server. After that, matching of the data is confirmed on the side of another client on the basis of the distributed data's destination information or the editorial history information stored in the server.

16 Claims, 17 Drawing Sheets

FIG.4

《EXAMPLE OF A DATA FORMAT》

AAAAAAA.CCC
   ↑      ↑
DRAWING   EXTENSION REPRESENTING A DATA FORM
NUMBER   (txt, dat, etc.)

BBBBBBB DDD
   •      •

FIG.5

《EXAMPLE OF A DATA FORMAT》

| DATA NAME | USED COMMAND | HOST NAME OF WORKSTATION | USER NAME |
|---|---|---|---|
| AAAAAAA.CCC | HOLE CORNER • | WS 1 | A11 |
| BBBBBBB.DDD | HOLE CORNER CHAMFERING | WS 2 | B11 |
| EEEEEEE.FFF | REFERENCE | WS3 | C11 |

FIG. 6

```
《EXAMPLE OF A DATA FORMAT》
DATA NAME    HOST NAME OF   ADDRESS        OBJECT       TIME OF
             WORKSTATION    NUMBER                      TAKING OUT

AAAAAAA.CCC     WS 1        111.222.333.1  CORRECTION   19:11
AAAAAAA.CCC     WS 2        111.222.333.2  REFERENCE    20:00

BBBBBBB.DDD     WS 3        111.222.333.1  CORRECTION   17:00
```

FIG. 7

```
《EXAMPLE OF A DATA FORMAT》
AAAAAAA  CCC
   ↑      ↑
DRAWING  EXTENSION REPRESENTING A DATA FORM
NUMBER   (txt, dot, etc.)

BBBBBBB.DDD
    :  :
    :  :
```

(A CASE WHERE THE CLIENT 2 MAKES A DEMAND TO TAKE OUT THE DATA WHILE THE CLIENT 3 IS CORRECTING THE DATA)

METHOD AND APPARATUS FOR CONFIRMING MATCHING OF DATA IN A DISTRIBUTED PROCESSING SYSTEM

BACKGROUND OF THE INVENTION

1. Field of the Invention

The present invention relates to a method and an apparatus for confirming matching of data in a distributed processing system, which are suitable for use of a CAD (computer aided design) system made up of a server and plural clients.

2. Description of Related Art

A CAD system employing a distributed system as shown in FIG. 20 has widely spread in these years at a job site where products are designed or manufactured. Such CAD system is configured with a server 1 and plural clients (terminal equipments such as workstations) 2 and 3 connected to each other through a local area network (referred simply as a LAN, hereinafter) laid in a compound or an office.

Referring to FIG. 20, reference numeral 4 denotes a gateway machine (a GW machine), 51 denotes a basic LAN, 52 denotes a sectional LAN, 53 a transceiver, and 54 denotes a terminal resistor.

The server 1 stores or manages a product database such as drawings of parts of products, three-dimensional data, etc., which is connected to the basic LAN 51 through the transceiver 53. The basic LAN 51 is a basic network, which is connected to the sectional LAN 52 provided for each section (for example, a designing section, a manufacturing section, etc.) through the gateway machine 4.

The sectional LAN 52 is connected to plural clients (only clients 2 and 3 are shown in FIG. 20) through the transceiver 53. The clients 2,3 can make a request for information in the database from the server 1 to refer to or update the database.

In an operation of the CAD system in a distributed processing system configured around the server 1 of this sort, to maintain matching of the data of a product made through the CAD system is sometimes a big problem.

If plural design groups design, in cooperation, one product, or if a manufacturing section and a designing section examine or alter a design of a product in parallel, the work of the design is carried out in the clients 2,3 dispersed in each group or section. As a result, each designer manages the design data in a different way so that it is difficult to manage the CAD data uniformly.

For instance, if a designer calls out the data base from the server 1 through the client 2 for a design work and stores the CAD data after the design work as sub-database in the client 2, the database in the server 1 is not updated and the old data before the design work remains in the server 1. Under such situation, if another designer takes out the database from the server 1 to do a design work through the client 3, the designer cannot confirm matching of the CAD data.

SUMMERY OF THE INVENTION

An object of this invention is to provide a method and an apparatus for confirming matching of data in a distributed processing system, which allow easy confirmation of matching of data and an efficient parallel design work in a distributed processing system.

This invention therefore provides a method for confirming matching of data in a distributed processing system in which a server having a database and plural clients using data in said database in said server being connected to each other through a network, comprising the steps of storing distributed data's destination information of data stored in said database on the side of said server, receiving editorial history information of said data at a distributed data's destination client on the side of said server to store said editorial history information of said data at said distributed data's destination client on the side of said server, and confirming, after that, matching of the data on the side of a client on the basis of one of the distributed data's destination information and the editorial history information stored in said server.

According to the method for confirming matching of data in a distributed processing system of this invention, the server stores distributed data's destination information and receives editorial history information from a distributed data's destination client to store the editorial history information of the data at the distributed data's destination client. The client demands the distributed data's destination information or the editorial history information of the data stored in the server so that the user can confirm matching of the data certainly on the side of the client.

This invention also provides an apparatus for confirming matching of data in a distributed processing system in which a server having a database and plural clients using data in said database in said server being connected to each other through a network, said server comprising said database, a distributed data's destination storing unit for storing therein distributed data's destination information of data in said database, an editorial history storing unit for storing therein editorial history information of the data at a distributed data's destination client, a data communication function unit for transmitting and receiving the data to and from said clients, said client comprising a data communication function unit for transmitting and receiving data to and from said server or another client, a sub-database for storing the data in said database in said server, a data edit function unit for editing the data, an editorial history storing unit for storing editorial history information depending on a result of edition performed in said data edit function unit, a display unit, a distributed data's destination information demanding unit for demanding the distributed data's destination information stored in said server from said distributed data's destination storing unit of said server through said data communication function unit, an editorial history information demanding unit for demanding the editorial history information from said editorial history storing unit of a distributed data's destination client or said server on the basis of said distributed data's destination information obtained by said distributed data's destination information demanding unit, and an editorial history information display control unit for displaying the editorial history information obtained by said editorial history information demanding unit on said display unit.

With the above structure, the image information demanding unit demands image information of a final state of an editorial history of data at the distributed data's destination client on the basis of distributed data's destination information obtained by the distributed data's destination information demanding unit. This image information is displayed as an image on the display unit under a control of the image information display control unit. The user can, thereby, confirm matching of the data easily on the side of the client. If another client edits the same data, the user can grasp concretely a content of the edition since the content is displayed as the image information on the screen on the side of the client so that it is possible to keep matching of the CAD data in a distributed processing system.

BRIEF DESCRIPTION OF THE DRAWINGS

FIG. 4 shows an example of a data format of a database according to the embodiment of this invention;

FIG. 5 shows an example of a data format of an editorial history storing unit according to the embodiment of this invention;

FIG. 6 shows an example of a data format of a distributed data's destination storing unit according to the embodiment of this invention;

FIG. 7 shows an example of a data format of a sub-database according to the embodiment of this invention;

DESCRIPTION OF THE PREFERRED EMBODIMENTS (a) Description of Aspects of the Invention In FIG. 1, reference numeral 1 denotes a server.

Figure 1:
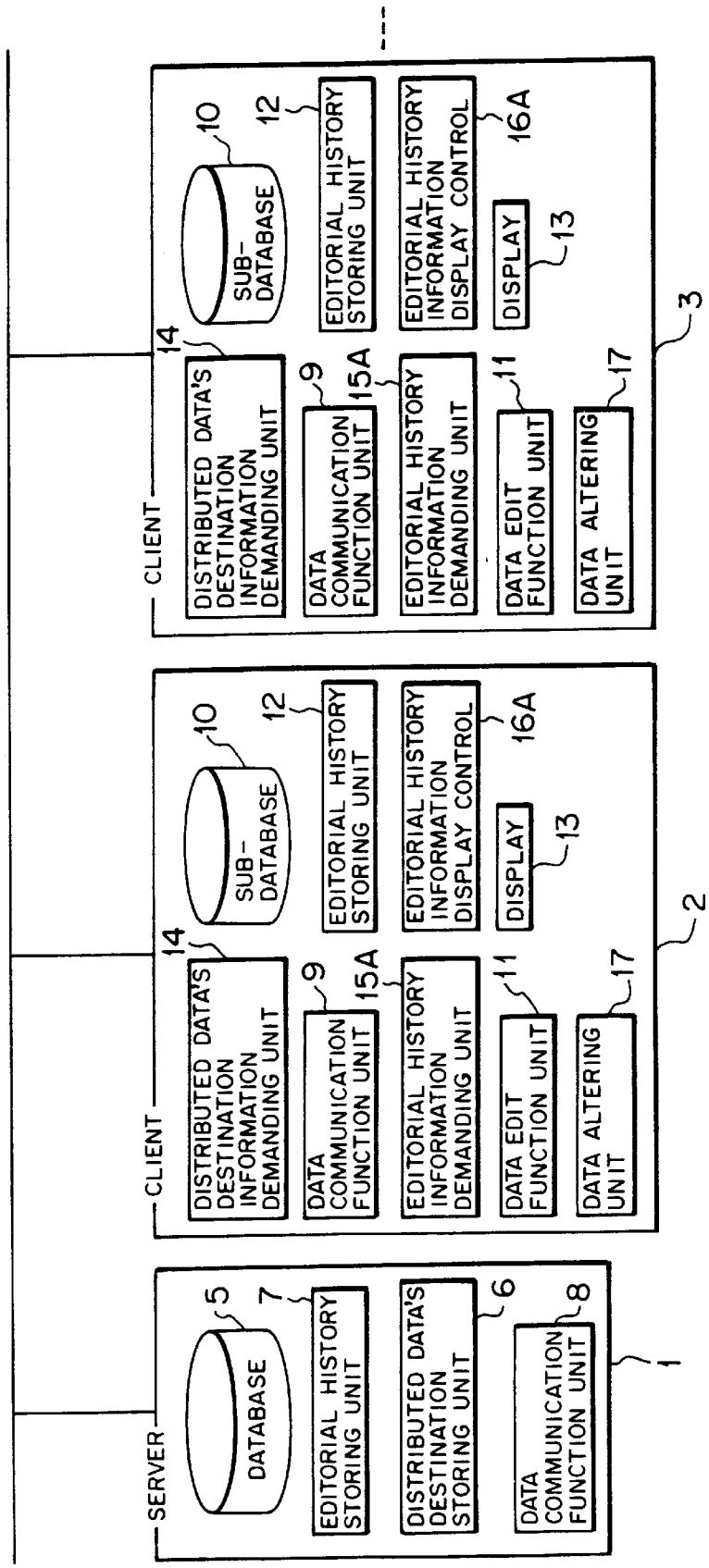
FIG. 1 is a block diagram showing an aspect of this invention.

The server 1 is provided with a database 5, a distributed data's destination storing unit 6, an editorial history storing unit 7 and a data communication function unit 8.

The database 5 stores data such as design data of products therein. The distributed data's destination storing unit 6 stores information of destinations to which data in the database is distributed.

The editorial history storing unit 7 stores information of an editorial history at the client 3 that is a destination to which the data is distributed. The data communication function unit 8 transmits and receives data to and from the clients 2 and 3.

Each of the clients 2,3 is provided with a data communication function unit 9, a sub-database 10, a data edit function unit 11, an editorial history storing unit 12, a display unit 13, a distributed data's destination information demanding unit 14, an editorial history information demanding unit 15A, an editorial history information display control unit 16A, and a data altering unit 17.

The data communication function unit 9 transmits and receives data to and from another client 3 or 2. The sub-database 10 stores data of the database 5 of the server 1. The data edit function unit 11 edits data.

The editorial history storing unit 12 stores information of an editorial history depending on a result of edition performed in the data edit function unit 11. The display unit 13 displays data thereon.

The distributed data's destination information demanding unit 14 demands distributed data's destination information stored in the server 1 from the distributed data's destination storing unit 6 of the server 1 through the data communication function unit 9. The editorial history information demanding unit 15A demands editorial history information from the editorial history storing unit 12 of the distributed data's destination client 3 or the editorial history storing unit 7 of the server 1 on the basis of the distributed data's destination information obtained by the distributed data's destination information demanding unit 14.

The editorial history information display control unit 16A causes the display unit 13 to display thereon the editorial history information obtained by the editorial history information demanding unit 15A. The data altering unit 17 alters data of the clients 2,3 on the basis of the editorial history information of a client that is a destination to which the data has been distributed sent to the clients 2,3.

Figure 2:
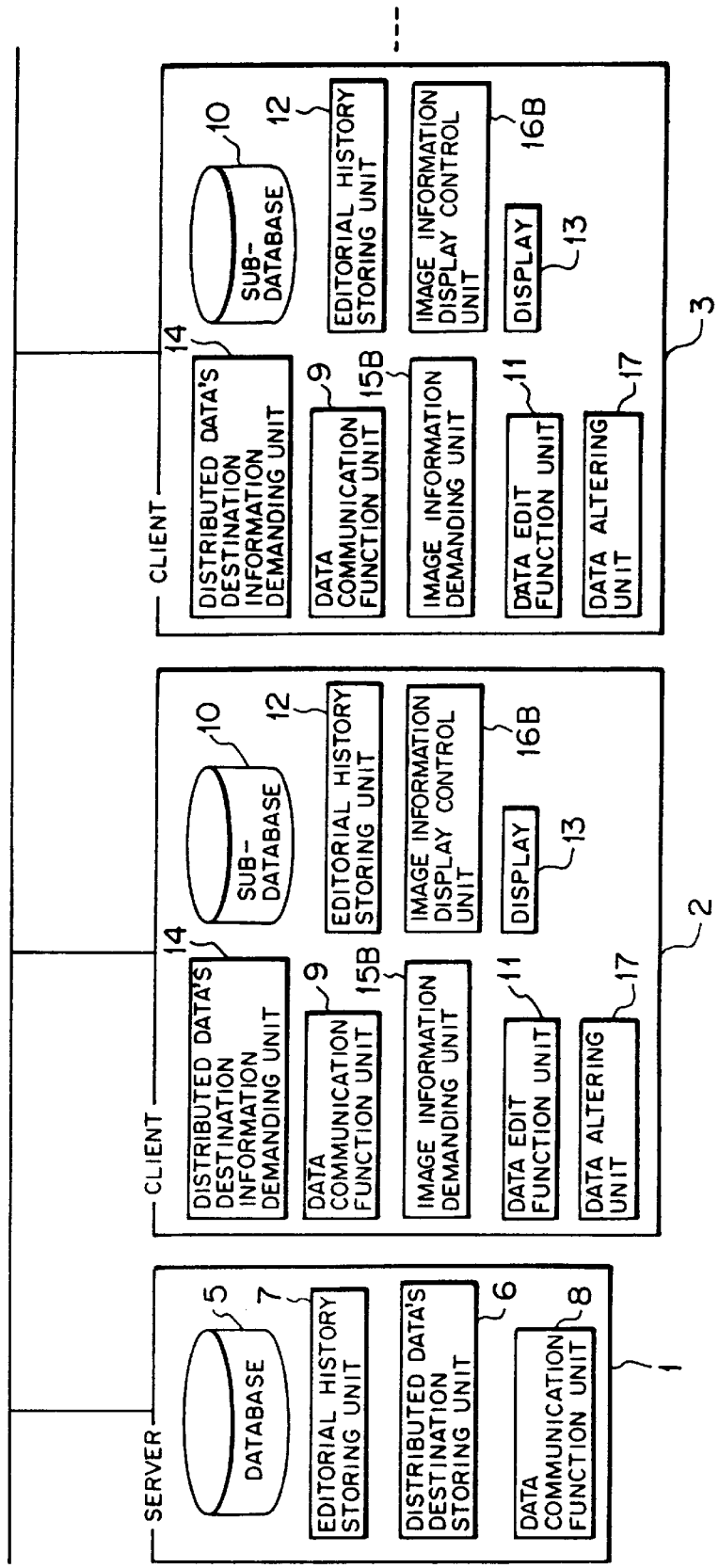
FIG. 2 is a block diagram showing another aspect of this invention.

FIG. 2 is also a block diagram showing another aspect of this invention. In FIG. 2, reference numeral 1 denotes a server. The server 1 is provided with a database 5, a distributed data's destination storing unit 6, an editorial history storing unit 7, and a data communication function unit 8.

The database 5 stores data such as design data of products. The distributed data's destination storing unit 6 stores information of destinations to which data in the database is distributed.

The editorial history storing unit 7 stores information of an editorial history at a client 3 that is a destination to which the data has been distributed. The data communication function unit 8 transmits and receives data to and from the clients 2 and 3.

In terms of the clients 2,3, each of the clients 2,3 has a data communication function unit 9, a sub-database 10, a data edit function unit 11, an editorial history storing unit 12, a display unit 13, a distributed data's destination information demanding unit 14, an image information demanding unit 15B, and image information display control unit 16B and a data altering unit 17.

The data communication function unit 9 transmits and receives data to and from the server 1 or another client. The sub-database 10 stores data of the database 5 of the server 1. The data edit function unit 11 edits data.

The editorial history storing unit 12 stores information of an editorial history depending on a result of edition performed in the data edit function unit 11. The display unit 13 is a display for showing the data.

The distributed data's destination information demanding unit 14 demands information of a destination to which data has been distributed stored in the server 1 from the distributed data's destination storing unit 6 in the server 1 through the data communication function unit 9. The image information demanding unit 15B demands image information indicating a final state of the editorial history at the distributed data's destination client 3 from the sub-database 10 of the distributed data's destination client 3 obtained by the distributed data's destination information demanding unit 14.

The image information display control unit 16B causes the display unit 13 to display thereon the image information obtained by the image information demanding unit 15B. The data altering unit 17 alters data of the client 2 on the basis of the image information of the distributed data's destination client 3 sent to the client 2.

Now, a function of the above-mentioned data matching confirming method in a distributed processing system shown in FIG. 1 will be described.

According to this data matching confirming method, the data communication function unit 8 of the server 1 transmits and receives data to and from the clients 2,3. The distributed data's destination storing unit 6 provided in the server 1 stores information of a destination to which the data of the database 5 has been distributed, besides the editorial history storing unit 7 stores information of an editorial history at the distributed data's destination client 3.

On the side of the client 2, the data communication function unit 9 provided in the client 2 transmits and receives data to and from the server 1 or another client 3.

The data of the database 5 of the server 1 is stored in the sub-database 2, and edited by the data edit function unit 11. The editorial history storing unit 12 stores editorial history information depending on a result of edition performed by the data edit function unit 11.

At that time, the distributed data's destination information demanding unit 14 demands the distributed data's destination information stored in the server 1 from the distributed data's destination storing unit 6 of the server 1 through the data communication function unit 9. The editorial history information demanding unit 15A demands the editorial history information from the editorial history storing unit 12 of the distributed data's destination client 3 or the editorial history storing unit 7 of the server 1 on the basis of the distributed data's destination information obtained by the distributed data's destination information demanding unit 14. The editorial history information obtained by the editorial history information demanding unit 15A is displayed on the display unit 13 by the editorial history information control unit 16A.

Incidentally, the data altering unit 17 in the client 2 can alter the data of the client 2 on the basis of the editorial history information of the distributed data's destination client 3 send to the client 2.

Now, a function of the above-mentioned data matching confirming method in the distributed processing system shown in FIG. 2 will be described.

According to this data matching confirming method, data is transmitted and received between the server 1 and the clients 2,3 via the data communication function unit 8 of the server 1. Information of a destination to which the data of the database 5 has been distributed is stored in the distributed data storing unit 6 in the server 1, besides information of an editorial history at the distributed data's destination client 3 is stored in the editorial history storing unit 7.

On the side of the client 2, data is transmitted and received to and from the server 1 or another client 3 via the data communication function unit 9 provided in the client 2. The sub-database 10 stores data of the database 5 of the server 1 as image information.

When the data is edited by the data edit function unit 11 in the client 2, editorial history information depending on a result of edition performed by the above data edit function unit 11 is stored in the editorial history storing unit 12.

At that time, the distributed data's destination information demanding unit 14 demands the distributed data's destination information stored in the server 1 from the distributed data's destination storing unit 6 of the server 1 through the data communication function unit 9. The image information demanding unit 15B demands image information in a final state of the editorial history at the distributed data's destination client 3 from the sub-database 10 of the distributed data's destination client 3 on the basis of the distributed data's destination information obtained by the distributed data's destination information demanding unit 14B. Incidentally, this image information is displayed as an image on the display unit 13 by the image information display control unit 16B.

The data altering unit 17 provided in the client 2 can alter the data of the client 2 on the basis of the image information of the distributed data's destination client 3 sent to the client 2.

An operation common in the above data matching confirming methods shown in FIGS. 1 and 2 is as follows: Namely, the server 1 stores information of a destination to which data in the database has been distributed, besides receiving editorial history information from the distributed data's destination client 3 and storing this editorial history information at the distributed data's destination client 3. After that, another client 2 confirms matching of the data on the side of another client 2 on the basis of the distributed data's destination information or the editorial history information stored in the server 1.

In the data matching confirming apparatus used in the distributed processing system with the above structure, the editorial history information obtained by the editorial history information demanding unit of the client is displayed on the display unit by the editorial history information display control unit so that it is possible for the client to confirm readily matching of the data. In other words, the client can grasp a content of an edit work on data if another client works on the same data. As a result, matching of CAD data may be maintained in a distributed processing system.

On the side of the client, the data is altered by the data altering unit on the basis of the editorial history information of the distributed data's destination client. Accordingly, the data in the client is always replaced with the latest data so that the user (the designer) can edit the data at the client while fully grasping the data edition done by another client.

On the side of the client, the data is altered by the data altering unit on the basis of the image information of the distributed data's destination client. Accordingly, the data in the client is always replaced with the latest data so that the user (the designer) can edit the data at the client while fully grasping the image information done by another client.

Meanwhile, modes to confirm matching of data are as follows:

(1) a mode in which the client 2 demands distributed data's destination information of data stored in the server 1 when the client 2 makes a demand to take out the data in the database of the server 1 or the client 2 edits the data, and demands editorial history information of the data from the distributed data's destination client 3 on the basis of the distributed data's destination information to display the editorial history information on the side of the client 2, thereby confirming matching of the data on the side of the client 2;

(2) a mode in which the client 2 demands distributed data's destination information of data stored in the server 1 when the client 2 makes a demand to take out the data in the database of the server 1 or the client 2 edits the data, and makes a demand for an image information representing a final state of an editorial history of the data at the client 3 as an image from the distributed data's destination client 3 on the basis of the distributed data's destination information, after that, the image information of the editorial history in the final state is displayed on the side of the client 2, thereby confirming matching of the data;

(3) a mode in which the client 2 demands distributed data's destination information of data stored in the server 1 when the client 2 makes a demand to take out the data in the database in the server 1 or the client 2 edits the data, the client 2 demands the distributed data's information and editorial history information of the data at the distributed data's destination client 3 from the server 1 if the distributed data's destination client 3 is in a deactivated state when the client 2 demands the editorial history information from the distributed data's destination client 3 on the basis of the distributed data's destination information, after that, the editorial history information is displayed on the side of the client 2, thereby confirming matching of the data on the side of the client 2; and (4) a mode in which the client 2 demands distributed data's destination information of data and editorial history information of the data at the distributed data's destination client 3 stored in the server 1 when the client 2 edits the data, and the editorial history information is displayed on the side of the client 2, thereby confirming matching of the data on the side of the client 2.

The above modes to confirm matching of data may give the following effects.

In the case of (1), the editorial history information of the data at the distributed data's destination client 3 is displayed on the side of the client 2, whereby the client 2 can confirm accurately matching of the data when the client 2 makes a demand to take out the data. In other words, if the same data is edited in another client 3, the client 2 can grasp a content of an editorial work in the client 3 so that it is possible to confirm readily matching of the CAD data in the distributed system.

Further, the data of the client 2 is updated on the basis of the editorial history information fed from the distributed data's destination client 3, whereby client 2 can carry out any time an editorial work with the latest data. This permits an easy management of the data between the users (designers). If predetermined data is processed by plural clients 2,3 in a distributed processing system, the users (designers) can carry out their works efficiently.

If the distributed data's destination client 3 is in a deactivated state at that time, the client 2 can demand the editorial history information of data at the distributed data's destination client 3 from the server 1 so as to display the editorial history information on the side of the client 2. This permits the user (designer) to confirm readily matching of the data on the side of the client 2.

The user (designer) at client 2 can always edit with the latest data since the data of the client 2 is altered on the basis of the editorial history information of data at the distributed data's destination client 3 so that the data can be managed readily between the users (designers). Therefore, if predetermined data is processed by plural clients 2,3 in parallel in a distributed system as same as in the above case, it is possible to carry out the work efficiently.

In the case of (2) above-mentioned, it is possible to confirm matching of the data with an image on the side of the client 2. This enables more concrete recognition of a part of the data having been edited. As a result, the matching of the data can be recognized more certainly.

The user of the data can always grasp a state of the latest data since the data of the client 2 is altered on the basis of the image information of the data at the distributed data's destination client 3. The users can thereby edit the data, while paying an attention to a content of the edition of the data or the like each other.

In the case of (3) above-mentioned, if the distributed data's destination client 3 is in a activated state, the user (designer) at the client 2 can confirm matching of the data accurately when the client 2 edits the data.

If the distributed data's destination client 3 is in a deactivated state at that time, the client 2 demands distributed data's destination information of data and editorial history information of the data at the distributed data's destination client 3 so as to display the editorial history information on the side of the client 2, thereby confirming readily matching of the data on the side of the client 2. Even if the distributed data's destination client 3 is in a deactivated state because of, for example, an off state of a power source, it is possible for the user (designer) at client 2 to recognize the editorial history information on the side of the client 2.

It is also possible, in this case, to alter the data of the client 2 on the basis of the editorial history information of the data at the distributed data's destination client 3. As a result, if predetermined data is processed by plural clients 2,3 in parallel in a distributed processing system, the work can be carried out efficiently.

In the event of editing data by the client 2, the client 2 demands image information representing a final state of the editorial history of the data at the distributed data's destination client 3 from the distributed data's destination client 3 so as to display the image information on the side of the client 2, thereby confirming readily matching of the data with the image on the side of the client 2. In consequence, this enables the user (designer) at the client 2 to recognize a part of the data having been edited more concretely so as to confirm matching of the data more certainly.

The data of the client 2 is altered on the basis of the image information of the distributed data's destination client 3, so the users of the data can grasp any time the latest data and edit the data while paying an attention to a content of the edition of the data or the like each other.

In the case of (4) above-mentioned, it is possible for the user at the client 2 to confirm matching of data on the side of the client 2. If a considerably long time has been elapsed since the client 2 took out the data from the server 1, it is possible to confirm the matching of the data accurately and quickly. In this case, the data of the client 2 is also altered on the basis of the editorial history information of the data at the distributed data's destination client 3. As a result, if predetermined data is processed by plural clients 2,3 in parallel in a distributed processing system, it is possible to carry out the work efficiently.

(b) Description of Embodiment of the Invention

Figure 3:
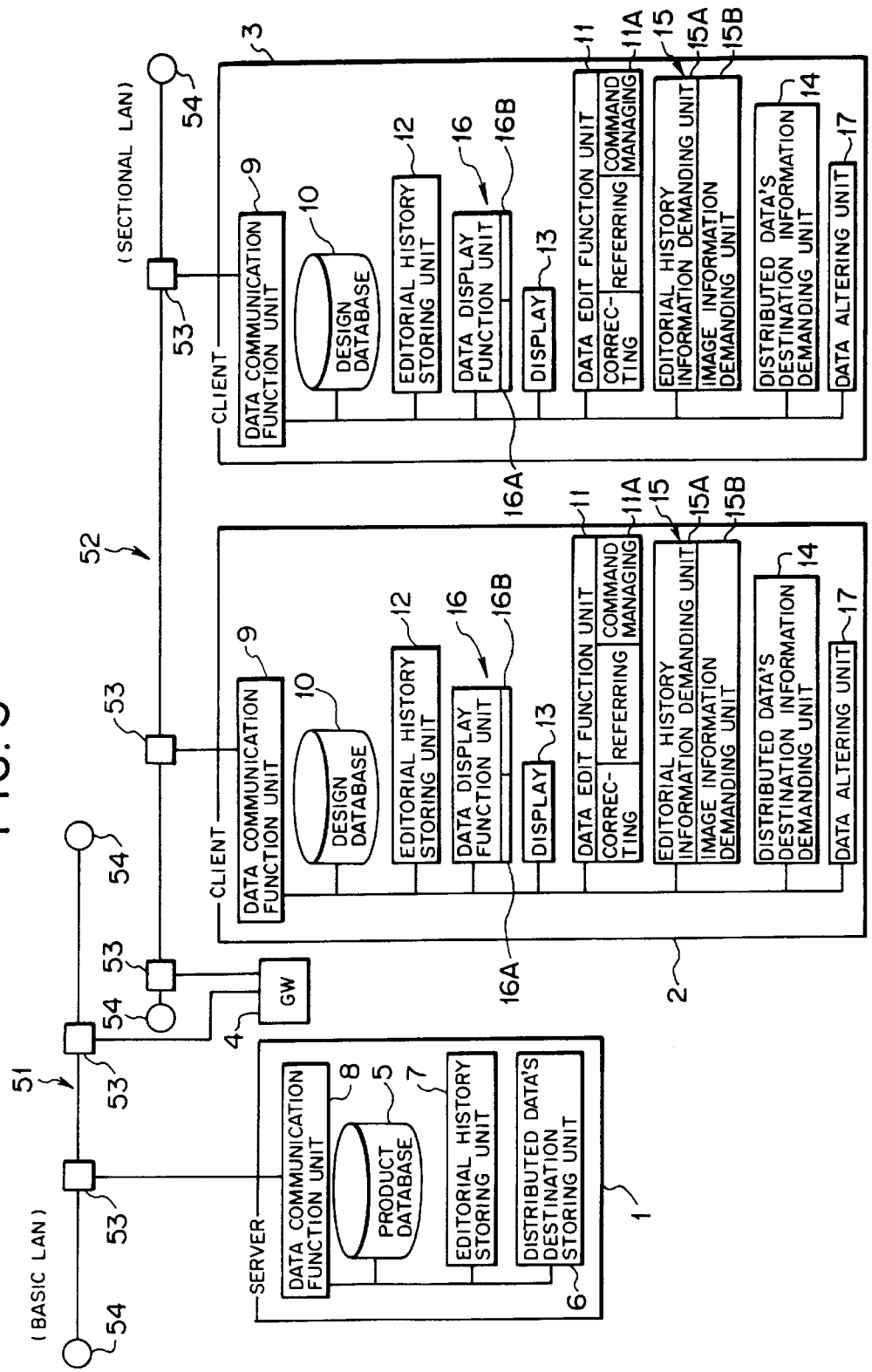
FIG. 3 is a block diagram of an entire system according to an embodiment of this invention.

Next description will be of an embodiment of this invention referring to the drawings. FIG. 3 is a schematic block diagram showing an entire structure of a system according to an embodiment of this invention. As shown in FIG. 3, a distributed processing system of this invention itself is configured in substantially the same manner as the conventional system. More specifically, a server 1 is connected to a basic LAN 51, besides plural clients 2,3 are connected to a sectional LAN 52 provided for each section. The basic LAN 51 and the sectional LAN 52 are connected through a gateway machine (a GW machine) to each other. Between the basic LAN 51 and the server 1, the sectional LAN 52 and each of the clients 2,3, each of the LANs 51,52 and the GW machine 4, transceivers 53 are interposed. At the ends of the LANs 51,52, terminal resistors 54 are provided.

In FIG. 3, there are shown only one sectional LAN 52 and two clients. In practice, there are possibly included many other sectional LANs and clients in the system.

The distributed processing system shown in FIG. 3 has a structure applicable to a CAD system. The server 1, mainly, has a product database 5, a distributed data's destination storing unit 6, an editorial history storing unit 7 and a data communication function unit 8.

As an explanation of each element, the product database 5 stores design data for products, which is a main database collectively managing the data of products. The product database 5 stores data of practical drawings or model data (for example, three-dimensional CAD data, etc.) therein.

Figure 14:
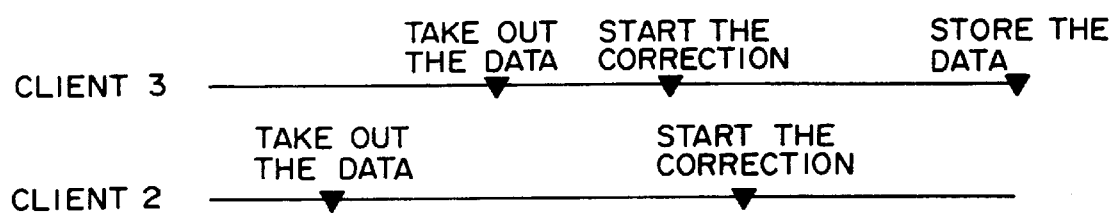
FIG. 14 is a timing chart showing an editorial work on the same data at plural clients according to the embodiment of this invention.

FIG. 4 shows an example of a data format of the product database 5. As shown in FIG. 14, leading several figures such as AAAAAAA. or BBBBBBB. in the drawing represent a drawing number, and an extension (CCC or DDD) following the leading figures represents a data form.

The distributed data's destination storing unit 6 stores information of destinations to which data in the database 5 is distributed. In other words, the distributed data's destination storing unit 5 stores information as to which client or to whom, for what purpose and when the data is distributed.

FIG. 6 shows an example of a data format of the distributed data's destination storing unit 6. When data is taken out from the database 5 in the server 1, the distributed data's destination storing unit 6 displays information of a destination of the distributed data. For more practical illustration using the distributed data's destination information shown in the upper column in FIG. 6, when data of AAAAAAA.CCC is taken out, there are provided a host name WS1 (that is, a name of a client) of a workstation having taken out the data, an address number 111.222.333.1 (that is, a name of a user), a purpose (for correction, reference, etc.) and the time when the data was taken out.

The editorial history storing unit 7 stores information of an editorial history of the data at the client 3 that is a destination of distributed data (hereinafter, the client 3 is designated as a client that is a destination to which data is distributed). More specifically, the editorial history storing unit 7 is to store, on the side of the server 1, by which command a designer has corrected or referred to (or is correcting or referring to) the data. The editorial history storing unit 7 stores histories of all data in the database 5. FIG. 5 shows an example of a data format of the editorial history storing unit 7. The editorial history storing unit 7 allows a display of a history of commands having been used so that it becomes possible to confirm how the data has been corrected. If the data has been only referred to, a command having been used is displayed merely as "reference".

The data communication function unit 8 has a transit function to get an access to the clients 2,3, through which another units 5, 6 and 7 can transmit and receive data to and from the clients 2,3. The data communication function unit 8 checks a state of correction of the data in the database 5.

As an explanation of the clients 2,3, the clients 2,3 are terminals having the same function, which demand information of data from the server 1 to refer to or correct the data.

Each of the clients 2,3 has a data communication function unit 9, a sub-database (a design database) 10, a data edit function unit 11, an editorial history storing unit 12, a display unit (a display) 13, a distributed data's destination information demanding unit 14, an information demanding unit 15, a data display function unit 16 and a data altering unit 17. The sub-database 10 and each of the units 11 through 17 are connected to the sectional LAN 52 through the data communication function unit 9.

The data communication function unit 9 has the same function as the above-mentioned data communication function unit 8 of the server 1, which transmits and receives data to and from the server 1 or another client 3 or 2. In other words, the data communication function unit 9 is a transit function unit to get an access to the server 1 or another client 3 or 2. Another units 11 through 17 provided in the client 2 or 3 can communicate through this data communication function unit 9.

The sub-database 10 stores data of the database 5 of the server 1, which functions as a product database used by the designer, that is, a design database. FIG. 7 shows an example of a data format of the sub-database 10, where the data format is similar to that of the main database 5 shown in FIG. 4.

The data edit function unit 11 has a command to instruct data directly when the data having been taken out from the database 5 in the server 1 is corrected or referred to. The data edit function unit 11 is provided with a command managing function unit 11A, through which a command having been used is stored in the editorial history storing unit 12.

The editorial history storing unit 12 stores information of an editorial history depending on a result of edition by the data edit function unit 11, which corresponds to the editorial history storing unit 7 of the server 1. More specifically, the editorial history storing unit 12 stores, on the side of the client 2 or 3, information as to which command has been used (or is being used) by the designer to correct or referred to the data. A data format of the editorial history storing unit 12 is similar to that of the editorial history storing unit 7 of the server 1 (refer to FIG. 5).

The display unit 13 is a display of the client 2 or 3, which displays data thereon.

The distributed data's destination information demanding unit 14 demands information of a destination of distributed data stored in the server 1 from the distributed data's destination storing unit 6 of the server 1 through the data communication function unit 9. It is therefore possible for the client 2,3 to manage the destinations to which the data in the database 1 has been distributed.

The information demanding unit 15 is configured as an editorial history information demanding unit 15A or an image information demanding unit 15B. The editorial history information demanding unit 15A accesses to the distributed data's destination client 3 or the server 1 on the basis of the distributed data's destination information obtained by the distributed data's destination information demanding unit 14 to demand the editorial history information as, for example, character information from the editorial history storing unit 12 of the distributed data's destination client 3 or the editorial history information storing unit 7 of the server 1. If the data is being taken out from the database 5 of the server 1 by another client 3, the client 2 can confirm on the display 13 which sort of correction has been made on the data in the distributed data's destination client 3 by referring to the editorial history information supplied from the editorial history information demanding unit 15A so as to confirm matching of the data.

The image information demanding unit 15B accesses to the distributed data's destination client 3 on the basis of distributed data's destination information obtained by the above-mentioned distributed data's destination information demanding unit 14 to demand image information representing a final state of an editorial history of data at the distributed data's destination client 3 as an image (for example, three-dimensional CAD data, a plan view, etc.) from the sub-database of the distributed data's destination client 3.

If the data in the database 5 of the server 1 is being taken out by another client 3, the client 2 can display, as an image, the final state of the data at the distributed data's destination client 3 on the display 13 by virtue of the image information demanding unit 15B so as to confirm matching of the data.

Incidentally, it is possible to provide both of the editorial history information demanding unit 15A and the image information demanding unit 15B in each of the clients 2,3. In which case, the client 2 can recognize both editorial history information and image information of data having been taken out from the server 1 by the client 3. Alternatively, it is possible to display either the editorial information or the image information by selecting either one depending on a preference of the user or a condition of the design.

The data display function unit 16 is a function unit adapted to display information (image information, character information, etc.) transferred to the data display function unit 16 on the display unit 13. In practice, the data display function unit 16 functions as the editorial history information display control unit 16A displaying, on the display unit 13, editorial history information of data obtained by a demand made by the editorial history information demanding unit 15A, or the image information display control unit 16b displaying image information of the data obtained by a demand made by the image information demanding unit 15B.

In short, the editorial history of the data having been corrected at the distributed data's destination client 3 is displayed on the display 13, or represented as an image by the data display function unit 16.

Lastly, the data altering unit 17 alters data of the client 2 on the basis of the image information of data at the distributed data's destination client 3 supplied to client 2.

With the above structure, the data matching confirming apparatus used in a distributed processing system according to the embodiment of this invention functions, for example, as follows.

As a management of destinations of data and editorial histories of data by the server 1, the server 1 stores information of a destination of distributed data (information as to which client takes out the data) when the client 3 takes out the data from the database 5 of the server 1. The server 1 then receives editorial history information of the distributed data's destination client 3 to store the editorial history information of the data at the distributed data's destination client 3. After that, it is possible for another client 2 to confirm matching of the data on the side of the client 2 on the basis of the distributed data's destination information or the editorial history information of the data stored in the server 1.

Figure 8:
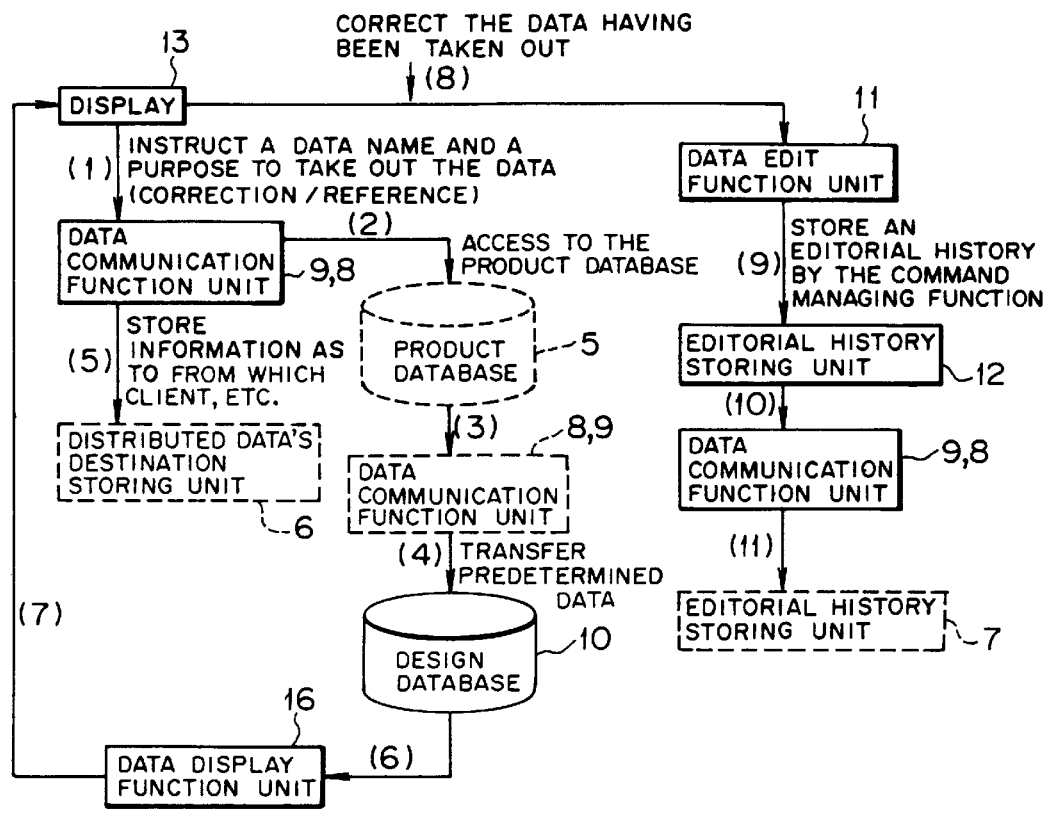
FIG. 8 illustrates an operation to manage distributed data's destinations and data edition according to the embodiment of this invention.

A practical operation of the above process is shown in FIG. 8. In FIG. 8, solid lines indicate processes performed by the clients 2,3, and broken lines indicate processes performed by the server 1.

The user (designer) gives an instruction to take out data from the database 6 of the server 1 through the display 13 of the client 3. At that time, the user inputs a name of data to be taken out and a purpose to use the data (such as correction, reference, etc.) to the client 3 [(1) in FIG. 8].

After that, this instruction is transmitted to the database 5 of the server 1 through the data communication function units 9,8 of the client 3 and the server 1 [(2) in FIG. 8]. The data is taken out from the database 5 according to a signal of this instruction [(3) in FIG. 8]. This data is transferred to the client 3 via the data communication function units 8,9 and stored in the sub-database 10 [(4) in FIG. 8].

At that time, information as to who takes out which data for what purpose by using which client is stored in the distributed data's destination storing unit 6 of the server 1 [(5) in FIG. 8].

On the side of the client 3, the data of the sub-database 10 is transferred to the data display function unit 16 [(6) in FIG. 8], and displayed on the display 13 [(7) in FIG. 8]. When the data is edited (corrected, referred to, etc.) [(8) in FIG. 8], commands (for example, a command to chamfer, etc.) have been used to edit the data are stored on occasion in the editorial history storing unit 12 [(9) in FIG. 8]. Information stored in the editorial history storing unit 12 is transmitted to the editorial history storing unit 7 ((11) in FIG. 8] via the data communication function unit 9 of the client 3 and the data communication function unit 8 of the server 1 [(10) in FIG. 8]. The information fed from the distributed data's destination storing unit 6 and the editorial history storing unit 7 of the server 1 is displayed on the side of the client 2 so that the matching of the data can be confirmed easily and certainly at the client 2. As a result, the user can edit the data at the client 2 while grasping a content of the edition done in the client 3.

Figure 9:
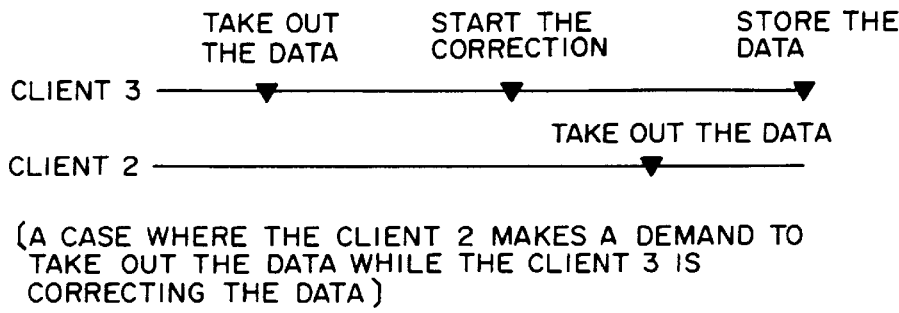
FIG. 9 is a timing chart illustrating an operation according to the embodiment of this invention in the case where while a client takes out data from a server and edits the data, another client demands to take out the same data from the server.
Figure 10:
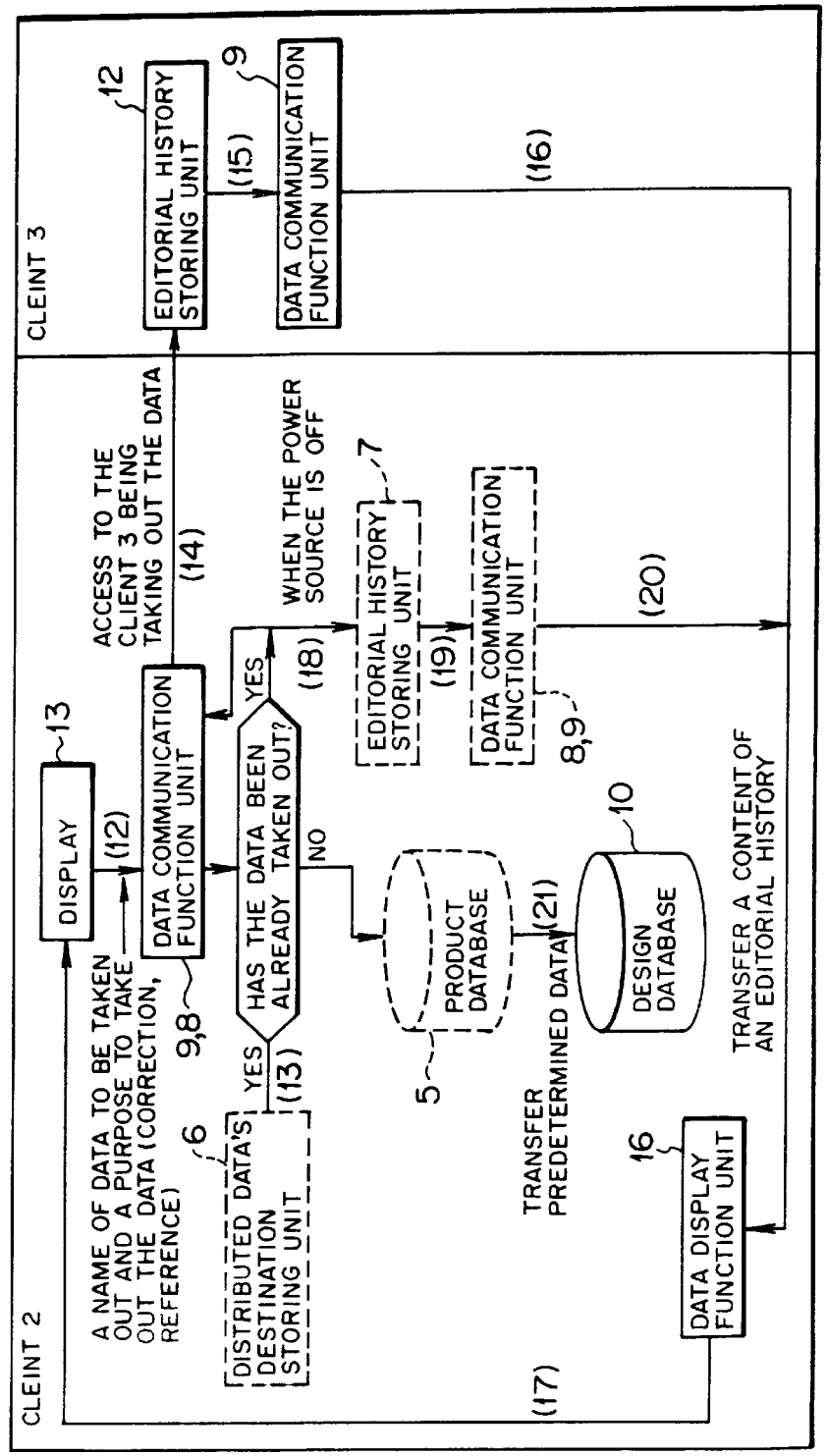
FIG. 10 illustrates an operation according to the embodiment of this invention to confirm matching of data using an editorial history of the data.
Figure 11:
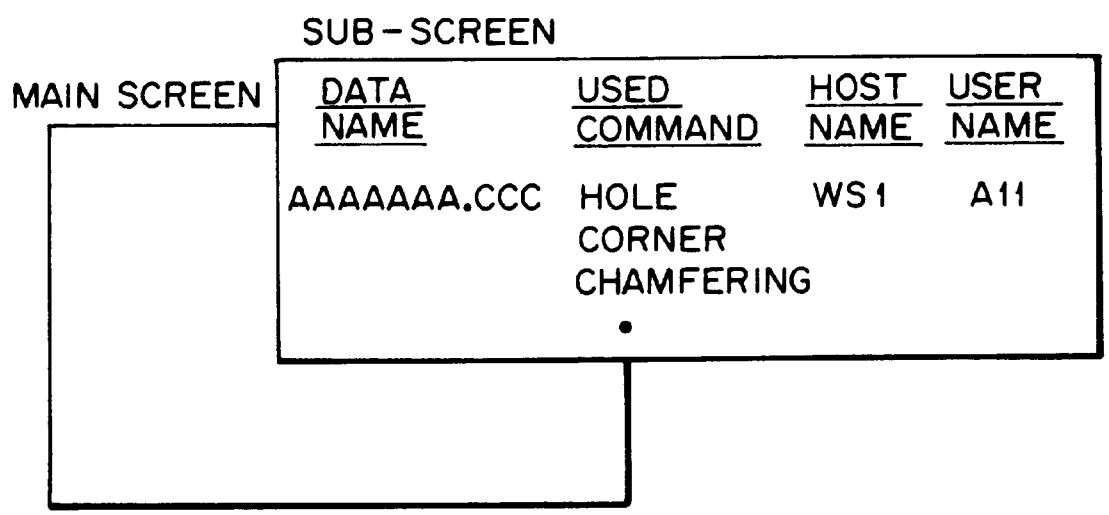
FIG. 11 shows an example of a display when matching of the data is confirmed according to the embodiment of this invention.
Figure 12:
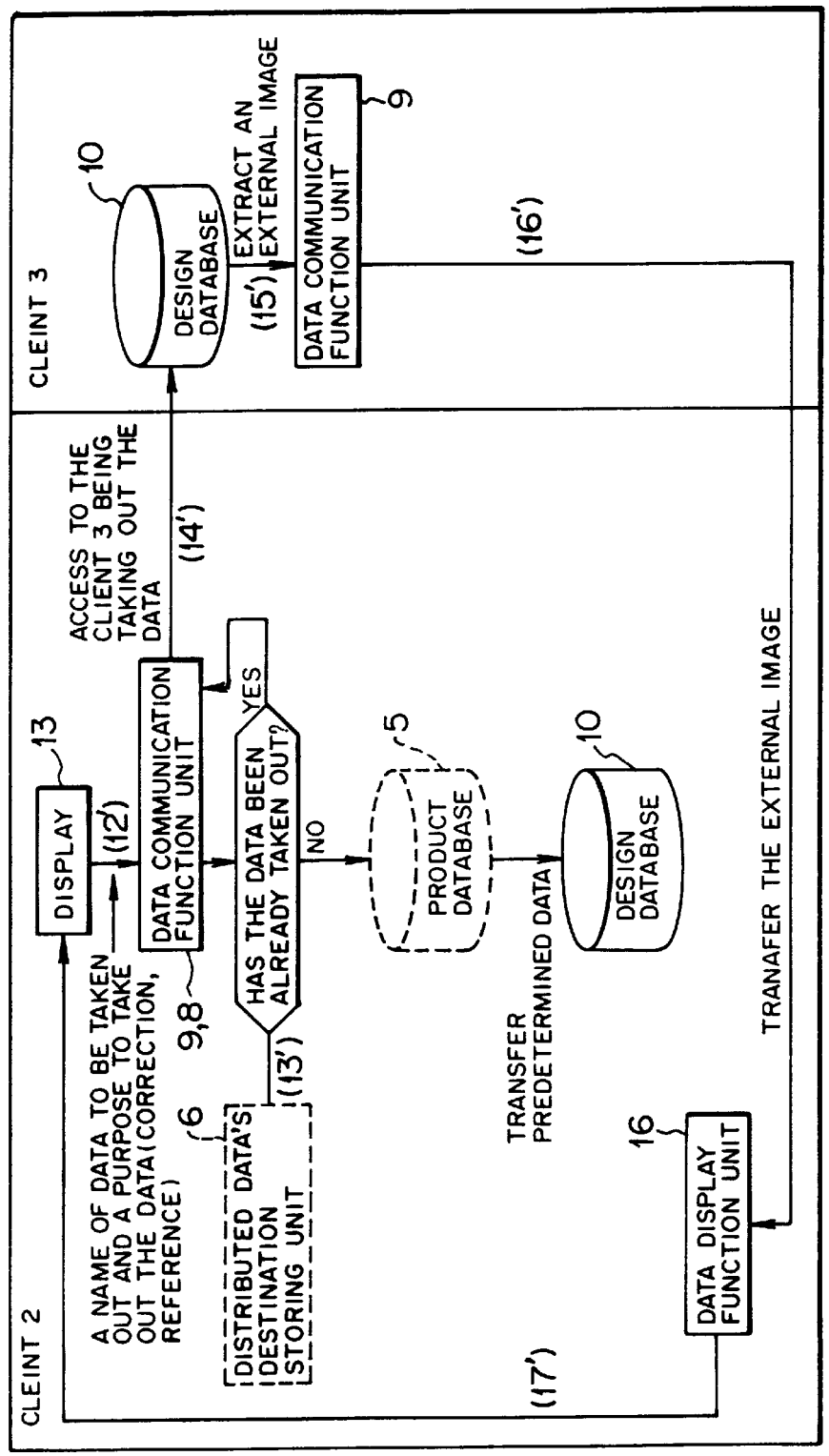
FIG. 12 illustrates an operation according to the embodiment of this invention to confirm matching of data using image information of the data.

Now referring to FIGS. 10 through 13, description will be next make of a manner to confirm matching of data in the case where a demand to take out data is made by the client 2 while the client 3 is editing the same data having been taken out from the server 1, as shown in FIG. 9. In FIGS. 10 and 12, solid lines indicate processes performed by the clients 2,3, and broken lines indicate processes performed by the server 1.

FIGS. 10 and 11 illustrates a method to confirm matching of data by using an editorial history of the data. In this case, the designer, first, inputs a name of data and a purpose to use the data to be taken out from the database 5 of the server 1 through the display 13 of the client 2 [(12) in FIG. 10] to get an access to the database 5 via the data communication function units 8,9 of the server 1 and the client 2. At that time, the server 1 judges whether the data has been already taken out by the client 3 or not.

If the data is being taken out by the client 3, the client 2 accesses to the distributed data's destination storing unit 6 of the server 1 via the distributed data's destination information demanding unit 14 (refer to FIG. 3) [(13 in FIG. 10] to makes a search as to which client has taken out this data.

The client 2 accesses to the client 3 (the distributed data's destination client) that has been found as a result of the search made according to a demand by the editorial history information demanding unit 15A (refer to FIG. 3) [(14) in FIG. 10] to demand a history of the data at the client 3.

Information supplied from the editorial history storing unit 12 of the distributed data's destination client 3 is transmitted to the data display function unit 16 [(16) in FIG. 10] via the data communication unit 9 [(15) in FIG. 10], and displayed on the display 13 of the client 2 [(17) in FIG. 10].

As above, a content of the editorial history stored in the editorial history storing unit 12 of the client 3 is displayed on the display 13 of the client 2 so that it becomes possible to confirm matching of the data on the side of the client 2.

FIG. 11 shows an example of a display on the display 13 of the client 2. As shown in FIG. 11, the history of the data at the client 3 is displayed as a sub-screen as against with a main screen on the display 13 of the client 2. It can be confirmed from the screen that commands for a hole, a corner, a chamfering have been used on the data.

If the distributed data's destination client is in a deactivated state when the client 2 has an access to the distributed data's destination client 3 (because the power source is cut, for example), the client 2 accesses to the editorial history storing unit 7 of the server 1 as shown in FIG. 10 [(18) in FIG. 10] to make a search into the editorial history of the data. Information obtained by the search is transmitted to the data display function unit 16 of the client 2 [(20) in FIG. 10] via the data communication function units 8,9 of the server 1 and the client 2 [(19) in FIG. 10], and displayed on the display 13 of the client 2.

Even after the required data has been taken out from the database 5 of the server 1 and the distributed data's destination client 3 is in a deactivated state before this data is again stored in the database 5, it is possible to demand the editorial history of the data from the server 1 so as to confirm the matching of the data on the display 13 of the client 2.

If the data is stored in the database 5 of the server 1 as shown in FIG. 10, the predetermined data is transferred from the database 5 to the design database of the client 2 via the data communication function units 8,9 [(21) in FIG. 10].

In FIG. 10, the history information of the data sent from the editorial history storing unit 12 of the distributed data's destination client 3 or the editorial history storing unit 7 of the server 1 is not limited to editorial history information of characters. It is possible to send image information of, for example, drawings or the like. A manner for confirming matching of the data in this case is shown in FIG. 12. In which case, confirmation of matching of the data is performed in a similar manner to the above-mentioned data matching confirming method by means of an editorial history, as shown in FIG. 12.

More specifically, the user (designer) inputs a name of data and a purpose to use the data to be taken out from the database 5 of the server 1 through the display 13 of the client 2 [(12) in FIG. 12], and accesses to the database 5 of the server 1. At that time, the server 1 judges whether this data is being taken out by another client 3 or not.

If this data is being taken out by another client 3, the client 2 accesses to the distributed data's destination storing unit 6 of the server 1 [(13') in FIG. 12] via the distributed data's destination information demanding unit 14 (refer to FIG. 3) to made a search as to which client has taken out this data.

The client 2 then accesses to the database of the client 3 that is a destination of the distributed data having been found from a result of the search made according to a demand by the image information demanding unit 15B (refer to FIG. 3) [(14') in FIG. 12], and demands image information representing a final state of an editorial history of the data at the client 3 as an image.

After that, the image information is extracted from the sub-database 10 of the client 3 [(15') in FIG. 12], and transmitted to the data display function unit 16 via the data communication function unit 9 [(16') in FIG. 12].

The data display function unit 16 displays the image information obtained by the image information demanding unit 15B on the display 13 [(17') in FIG. 12].

As above, the image in the database 10 of the client 3 is displayed on the display 13 of the client 2 so that it is possible on the side of the client 2 to confirm the matching of the data as an image.

Figure 13:
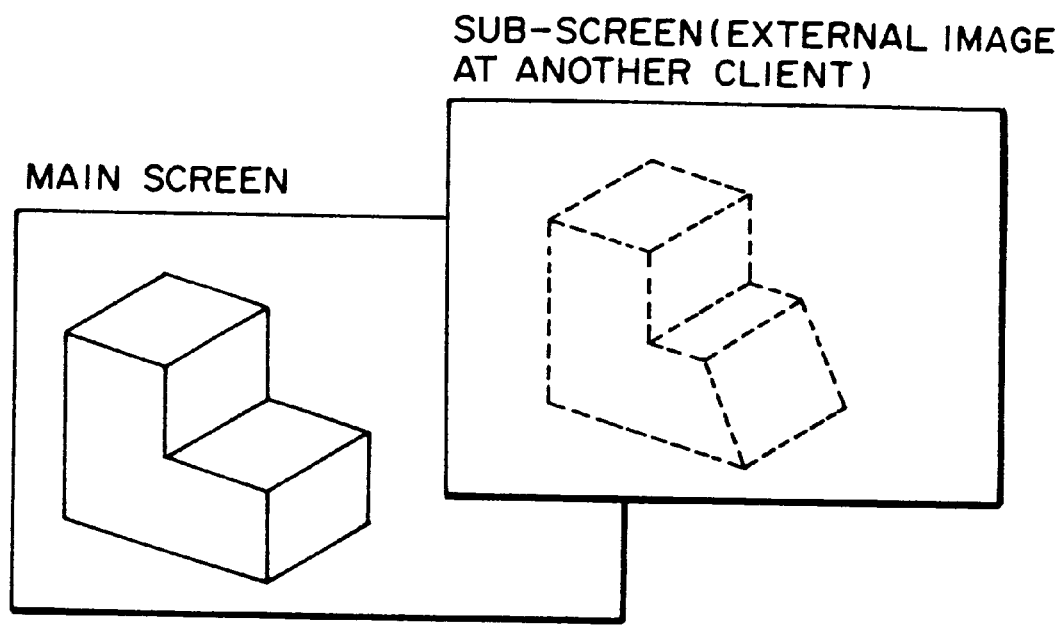
FIG. 13 shows an example of display when matching of data is confirmed according to the embodiment of this invention.

FIG. 13 shows an example of a display on the display 13 of the client 2 at that time. As shown in FIG. 13, an image of the data at the client 3 is represented as a sub-screen as against a main screen on the display 13 of the client 2. It is possible to confirm from the screen that the three-dimensional CAD data has been partly corrected at the client 3.

Next description will be of a method for confirming matching of data in a case shown in FIG. 14, that is, where the client 2 takes out predetermined data form the server 1, but another client 3 accesses to the server 1 to take out the same data and starts a correcting work on the above data before the client 2 starts a correcting work on the data. In other words, it is a method for confirming matching of data when the data is corrected (edited).

Figure 15:
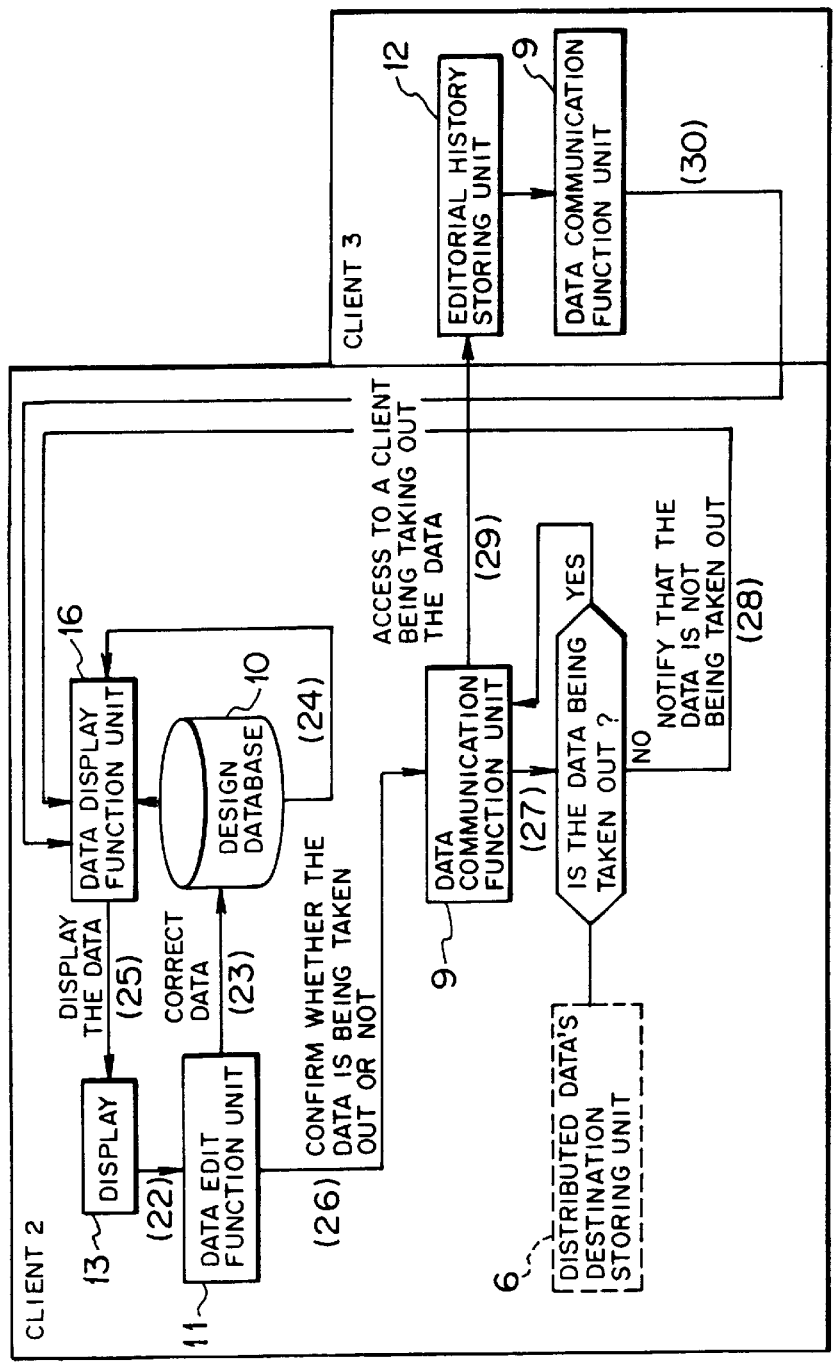
FIG. 15 illustrates an operation according to the embodiment of this invention to confirm matching of data when plural clients edit the same data simultaneously.

In the above case, it is possible to confirm the matching of the data according to a procedure shown in FIG. 15. Incidentally, solid lines indicate processes performed by the client 2,3, while broken lines indicate processes performed by the server 1. A procedure of the process until the client 2 gets an access to the server 1 to take out predetermined data from the database 5 (refer to FIGS. 8, 10 and 12) is here skipped.

First, the user (designer) instructs "correction" to the data edit function unit 11 [(23) in FIG. 15] through the display 13 [(22) in FIG. 15] to call out predetermined data from the sub-database 10 [(24) in FIG. 15]. The data display function unit 16 displays this data on the display 13 [(25) in FIG. 15].

At that time, the client 2 accesses to the server 1 through the data communication function unit 9 [(26) in FIG. 15] to make a search through the distributed data's destination storing unit 6 of the server 1 as to whether this data is distributed to another client or not [(27) in FIG. 15]. If this data is not being taken out by another client, this is notified to the display unit 16 of the client 2 [(28) in FIG. 15].

If this data is being distributed to another client, the client 2 accesses to the client 3 that is a destination of the distributed data [(29) in FIG. 15], and an editorial history of this data at the client 3 is transmitted to the data display function unit 16 of the client 2 through the editorial history storing unit 12 of the distributed data's destination client 3 [(30) in FIG. 15]. The display 13 displays the information inputted to the data display function unit 16, whereby plural clients 2,3 can edit or design at the same time. An example of the display on the display 13 of the client 2 is as shown in FIG. 11.

Alternatively, it is possible to access to the sub-database 10 of the distributed data's destination client 3 so as to transfer image information representing a final state of the editorial history of the data as an image to the client 2. This manner enables the client 2 to confirm directly a condition of the data having been corrected at another client 3 as an image. An example of this display on the display 13 of the client 2 is as shown in FIG. 13.

As above, the image information of the data at the client 3 is displayed on the side of the client 2, as well. This allows the client 2 to confirm matching of the data easily and certainly. As a result, the designer at the client 2 can edit the data while grasping a content of the edition of the data at the client 3.

In FIG. 15, there is skipped a description of a process in the case where the data is being distributed to another client 3 and that distributed data's destination client 3 is in a deactivated state (due to an off state of the power source or the like). In such case, editorial history information of the data may be obtained in a manner similar to that shown in FIG. 10. More specifically, the client 2 accesses to the editorial history storing unit 7 of the server 1 to supply the editorial history information stored in the editorial history storing unit 7 to the data display function unit 16, whereby the user can confirm the editorial history of the data at the client 3 on the side of the client 2.

Next description will be of a manner to confirm a condition of an edit work on the same data at another client 3 during an edit work by the client 2. In such case, the client 2 demands distributed data's destination information stored in the server 1 and editorial history information of the data at the distributed data's destination client 3 through the editorial history demanding unit 15A in the client 2 to display the editorial history information on the side of the client 2, whereby the user can confirm matching of the data on the side of the client 2.

Figure 16:
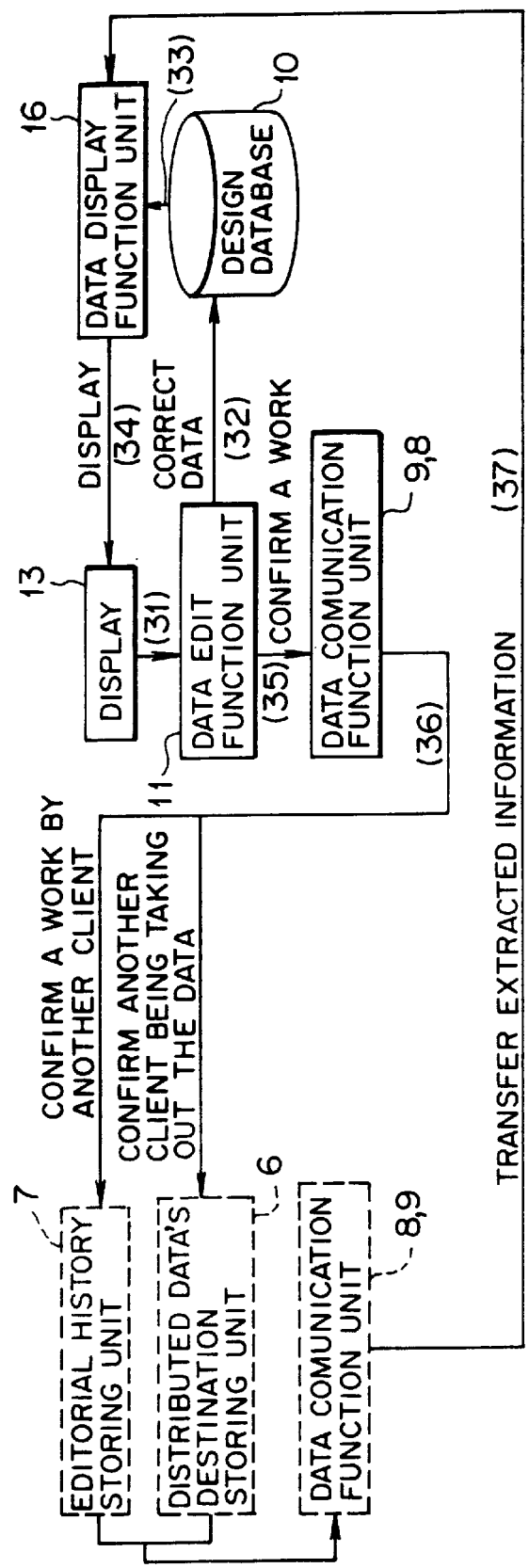
FIG. 16 illustrates an operation according to the embodiment of this invention to confirm a condition of an editorial work at another client.

More specifically, confirmation of matching of the data is performed according to a process shown in FIG. 16. Incidentally, solid lines indicate processes performed by the clients 2,3, and broken lines indicate processes performed by the client 1. In FIG. 16, a procedure of a process until the client 2 accesses to the server 1 to take out predetermined data from the database 5 is skipped.

As shown in FIG. 16, the client 2 instructs "correction" to the data edit function unit 11 through the display 13 [(31) in FIG. 16] to get an access to the database 10 in the client 2 [(32) in FIG. 16]. Then, the client 2 takes out predetermined data from the sub-database 10 and transfers this data to the data display function unit 16 [(33) in FIG. 16]. After that, this data is displayed on the display 13 [(34) in FIG. 16] so as to be edited (corrected).

At that time, the data edit function unit 11 sets a signal to demand information of this data stored in the server 1 through the editorial history demanding unit 15A (refer to FIG. 3) in order to confirm a condition of edit of this data at another client 3 [(35) in FIG. 16]. The client 2 accesses to the server 1 through the data communication function unit 9 [(36) in FIG. 16] so that information stored in the editorial history storing unit 7 and the distributed data's destination storing unit 6 stored in the server 1 is transferred to the data display function unit 16 of the client 2 [(37) in FIG. 16].

Figure 17:
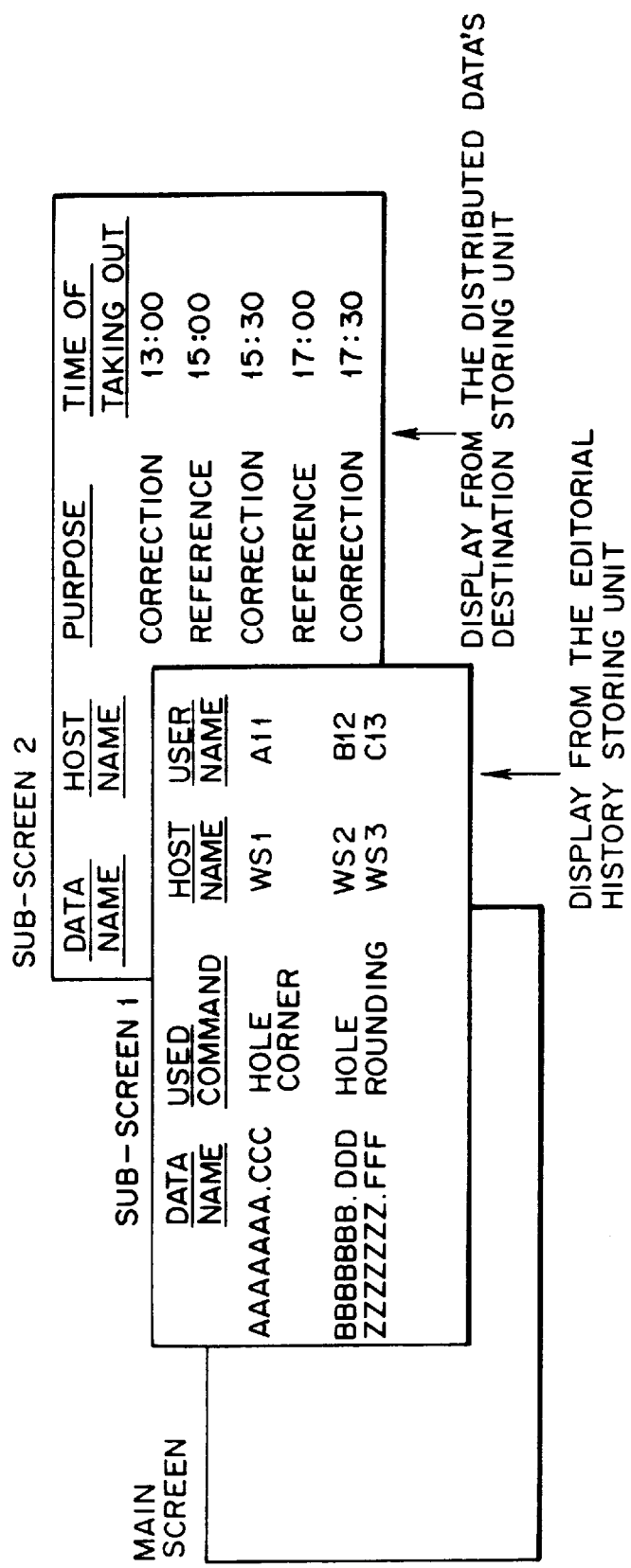
FIG. 17 shows an example of a display when matching of data is confirmed according to the embodiment of this invention.

The display 13 displays thereon a screen as shown in FIG. 17. In practice, the display 13 displays the information fed from the editorial history storing unit 7 and the distributed data's destination storing unit 6 to the data display function unit 16 as a sub-screen 1 and a sub-screen 2, respectively, so that the user (designer) can confirm matching of the data displayed on the main screen (not shown) with the information displayed on the sub-screens 1,2.

Even after a considerable time has been elapsed since the data was taken out, it is possible to confirm matching of the data accurately and quickly by directly accessing to the server 1.

Figure 18:
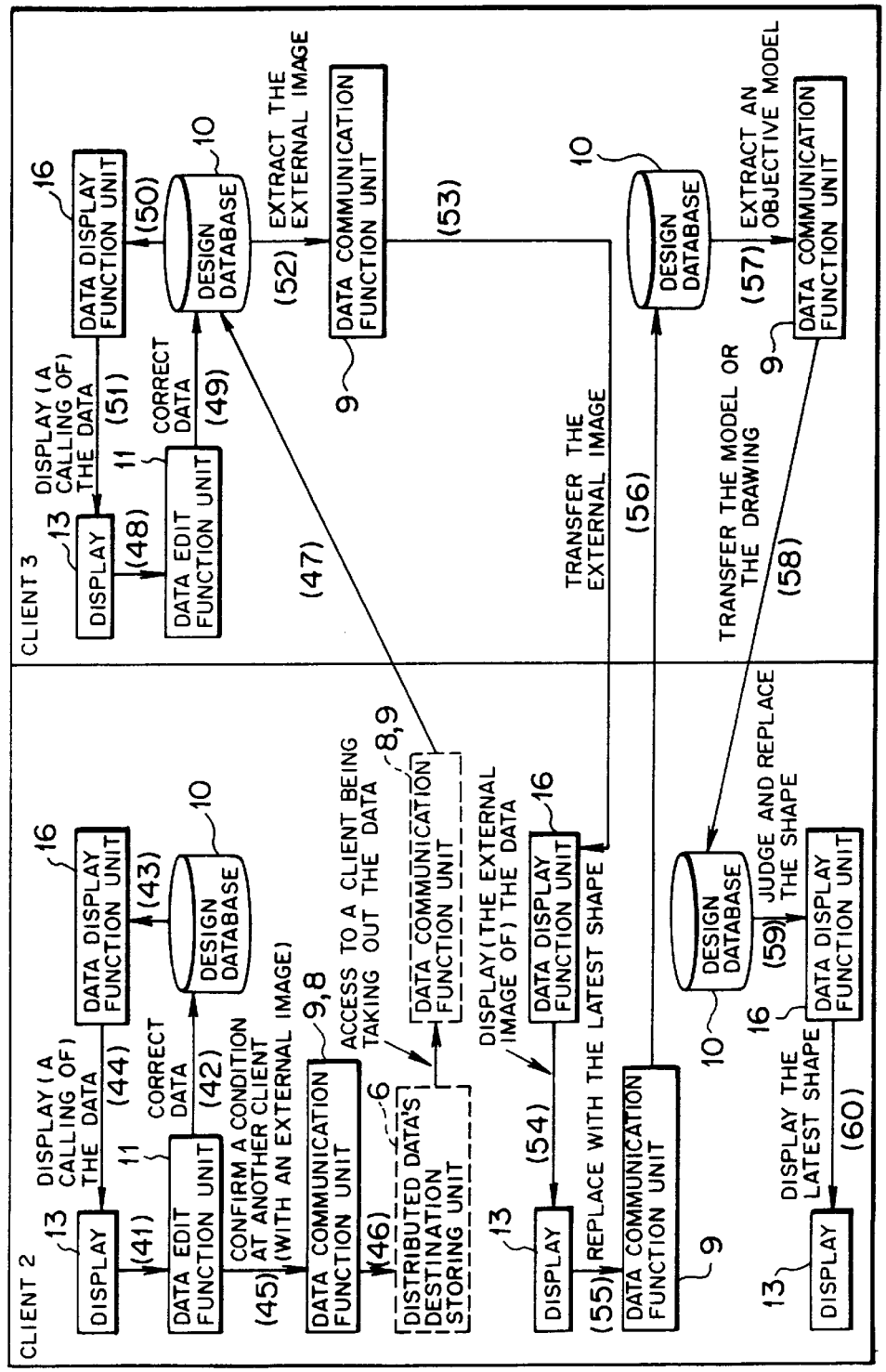
FIG. 18 illustrates an operation according to the embodiment of this invention to confirm matching of data when the client alters the data on the basis of data information sent from another client.

Next description will be of a manner to confirm the matching of the data in the case where data of the client 2 is altered based on the editorial history information or image information at the distributed data's destination client 3 that has been send to the client 2, by reference to FIG. 18. In FIG. 18, solid lines indicate processes performed by the clients 2,3, and broken lines indicate processes performed by the server 1.

As shown in FIG. 18, the client 2 instructs "correction" to the data edit function unit 11 through the display 13 [(41) in FIG. 18] to get an access to the sub-database 10 in the client 2 [(42) in FIG. 18].

The client 2 then takes out predetermined data from the sub-database 10, and transfers this data to the data display function unit 16 [(43) in FIG. 18]. After that, this data is displayed on the display 13 [(44) in FIG. 18] to be edited (corrected).

At that time, the data edit function unit 11 sets a signal to demand image information stored in the server 1 through the image information demanding unit 15B (refer to FIG. 3) [(45) in FIG. 18]. The client 2 accesses to the distributed data's destination storing unit 6 of the server 1 through the data communication function unit 9 [(46) in FIG. 18] so as to access to the sub-database 10 of the client 3 having the latest image of the data [(47) in FIG. 18].

On the side of the client 3, an editorial work is going on as same as in the client 2 [(48) through (51) in FIG. 18], and final data at this point of time is extracted as an image from the sub-database 10 [(52) in FIG. 18] and transferred to the data display function unit 16 of the client 2 through the data communication function unit 9 [(53) in FIG. 18].

A final state of the editorial history of the data is displayed as an image on the display 13 of the client 2 through the data display function unit 16 [(54) in FIG. 18]. A shape of the data having been displayed up to that time is newly replaced on the basis of the image information fed from the client 3 [(55) in FIG. 18].

On the side of the client 2, the user (designer) edits the data on the basis of the data having been replaced. As a result of this, the updated data is transferred to the sub-database 10 of the client 3 through the data communication function unit 9 [(56) in FIG. 18].

On the side of the client 3, as the edit work is proceeds at that time, a model of the data that is an object of the above data having been transferred from the client 2 [(56) in FIG. 18] is extracted from the database 10 [(57) in FIG. 18], and this data is again transferred to the sub-database 10 of the client 2 [(58) in FIG. 18].

The client 2 compares the model transferred to the sub-database 10 of the client 2 with a shape or the like of the model having been edited in the client 2, and transfers data having been newly updated in both of the clients 2,3 to the data display function unit 16 [(59) in FIG. 18]. A model in the final state is thereby displayed as an image on the display 13 [(60) in FIG. 18].

Figure 19:
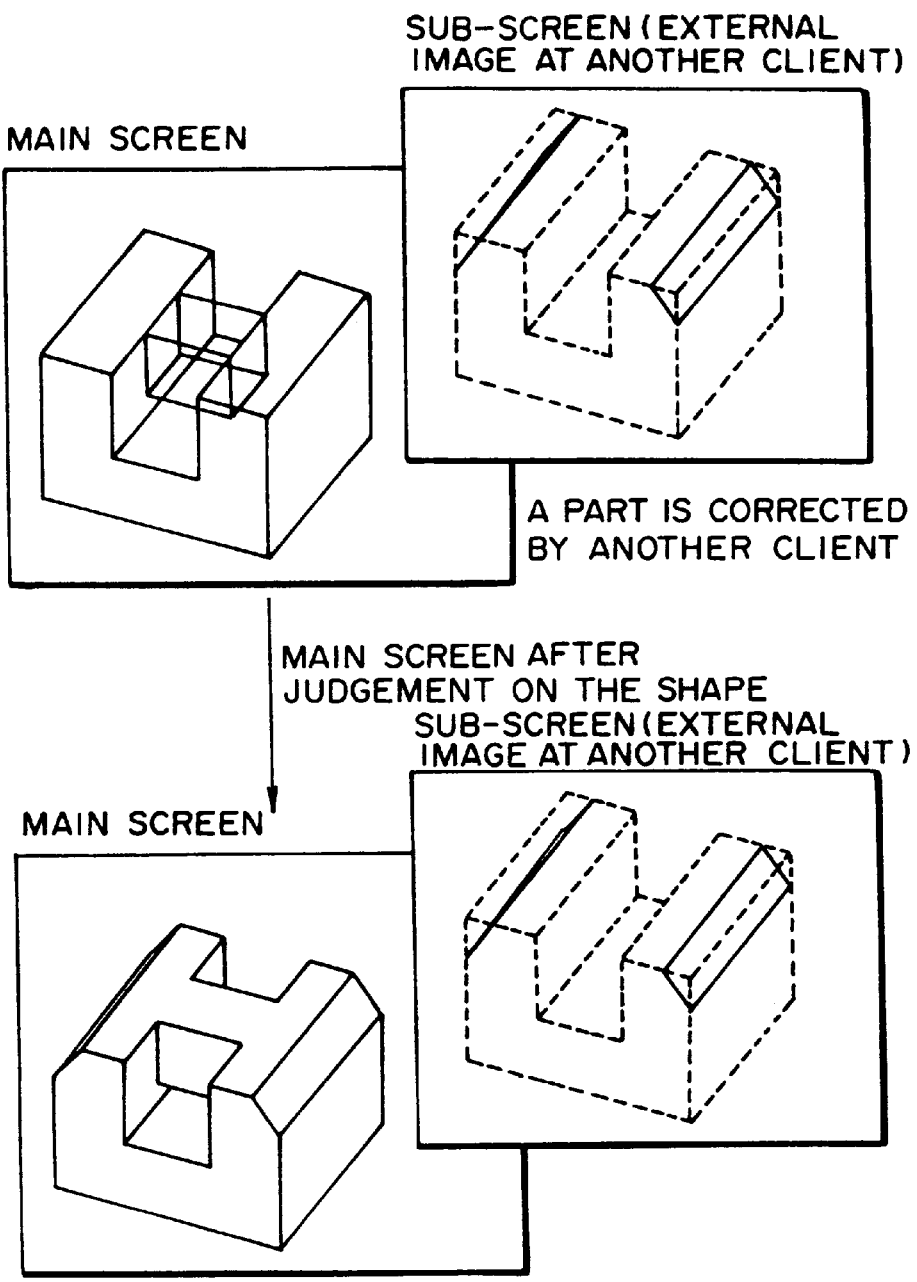
FIG. 19 shows an example of a display when matching of data is confirmed according to the embodiment of this invention.
Figure 20:
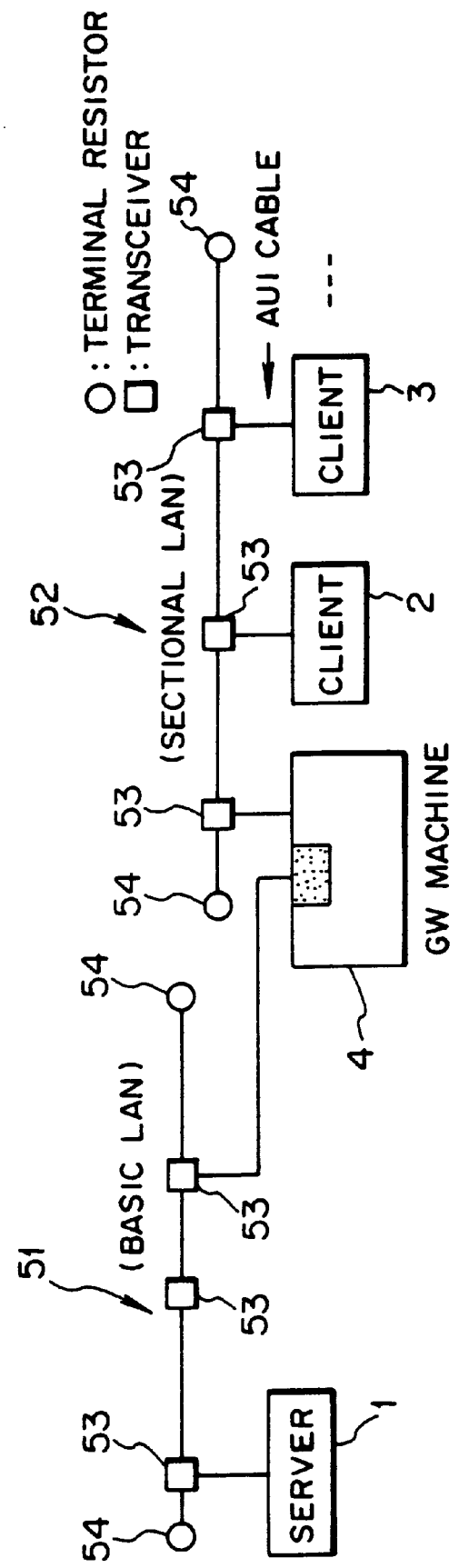
FIG. 20 is a schematic block diagram of a conventional distributed processing system.

In the lower half of FIG. 19, there is shown the model in the final state displayed on the display 13 of the client 2, while in the upper half of the same, there is shown the data of the client 3 at a point of time when the data was transferred to the data display function unit 16 of the client 2 [(53) in FIG. 18]. On the sub-screen, an external image of the data at the client 3 is displayed, while an image of the data under edition at the client 2 is displayed on the main screen.

When the editorial work at the client 2 is finished, the external image of the final data at the client 3 is displayed on the sub-screen as shown in the lower part of FIG. 19. On the main screen, there is displayed an image of the data including contents having been edited at the clients 2,3.

In FIG. 19, broken lines indicate an image at the client 3, while solid lines indicate an image at the client 2. Fat lines in FIG. 19 indicate a part subjected to the edition (correction) at each client.

As above, the above-mentioned data matching confirming method enables simultaneous edition of data at plural clients 2,3 while keeping matching of the data.

According to this invention, the user (designer) can grasp a condition of the data by virtue of a function to manage the matching and the editorial history of the data provided to a CAD system. This permits the users (designers) to correct the data while paying an attention to a content of the correction of the data each other. When the user (designer) takes out the data, the user can confirm in advance whether another designer (user) intends to edit the same data in a different way. This permits a management of the data between the designers (users).

As above, this invention allows an easy maintenance of matching of CAD data and an efficient parallel design work in a distributed processing system.

As having been described this invention by way of the above example, it should be noted that this invention is not limited to only a CAD system, but applicable widely to a distributed processing system configured with a server and plural clients.

What is claimed is:

1. A method for confirming matching of data in a distributed processing system comprising the steps of:

forming a database in a server of a distributed processing system, the database collectively managing design data used by a plurality of clients connected to each other and the server through a network;

receiving and storing editorial history information, indicating a history of commands used to modify the data, generated by and received from each client which modified the data on the server; and when a client accesses the design data, confirming that the design data to used by the client is the most recent version thereof by transmitting the editorial history information stored in the server to the client and comparing the editorial history information with the design data to be used by the client.

2. A method for confirming matching of data in a distributed processing system according to claim 1, wherein the data of the client is altered on the basis of the editorial history information of the data at the data's destination client fed to the client.

3. A method for confirming matching of data in a distributed processing system comprising the steps of:

forming a database in a server of a distributed processing system, the database storing data used by a plurality of clients connected to each other and the server through a network;

storing, on the server, destination information for data stored in said database;

receiving and storing editorial history information of the data from destination client on the server; and when a client makes a demand to take out data from the database in the server, demanding, by the client, the destination information of the data stored in said server, then demanding, by the client, the editorial history information from the data's destination client on the basis of the data's destination information so as to confirm matching of the data on the client by displaying the editorial history information on the client.

4. A method for confirming matching of data in a distributed processing system according to claim 3, wherein the data of the client is altered on the basis of the editorial history information of the data at the data's destination client fed to the client.

5. A method for confirming matching of data in a distributed processing system comprising the steps of:

forming a database in a server of a distributed processing system, the database storing data used by a plurality of clients connected to each other and the server through a network;

storing, on the server, destination information for data stored in said database;

receiving and storing editorial history information of the data from destination client on the server; and when a client makes a demand to take data from the database on the server, demanding, by the client, the data's destination information stored in said server, then demanding, by the client, image information representing a final state of an editorial history of the data at the data's destination client as an image from the data's destination client on the basis of the data's destination information so as to confirm matching of the data on the client by displaying the image information on the client.

6. A method for confirming matching of data in a distributed processing system according to claim 5, wherein the data of the client is altered on the basis of the editorial history information of the image information of the data at the data's destination client fed to the client.

7. A method for confirming matching of data in a distributed processing system comprising the steps of:

forming a database in a server of a distributed processing system, the database storing data used by a plurality of clients connected to each other and the server through a network;

storing, on the server, destination information for data stored in said database;

receiving and storing editorial history information of the data from destination client on the server; and when a client makes a demand to take data from the database on the server, demanding, by the client, the data's destination information stored in the server, then demanding, by the client, the data's destination information and the editorial history information of the data at the destination client from the server, if the data's destination client is in a deactivated state when the client demands the editorial history information from the data's destination client on the basis of the data's destination information to confirm matching of the data by the client by displaying the editorial history information on the client.

8. A method for confirming matching of data in a distributed processing system according to claim 7, wherein the data of the client is altered on the basis of the editorial history information of the data at the data's destination client fed to the client.

9. A method for confirming matching of data in a distributed processing system comprising the steps of:

forming a database in a server of a distributed processing system, the database storing data used by a plurality of clients connected to each other and the server through a network;

storing, on the server, destination information for data stored in said database;

receiving and storing editorial history information of the data from destination client on the server; and demanding, by the client, the data's destination information stored in the server when the client edits the data, then demanding, by the client, the editorial history information of the data from the data's destination client on the basis of the data's destination information to confirm the matching of the data by the client by displaying the editorial history information on the client.

10. A method for confirming matching of data in a distributed processing system according to claim 9, wherein the data of the client is altered on the basis of the editorial history information of the data at the data's destination client fed to the client.

11. A method for confirming matching of data in a distributed processing system comprising the steps of:

forming a database in a server of a distributed processing system, the database storing data used by a plurality of clients connected to each other and the server through a network;

storing, on the server, destination information for data stored in said database;

receiving and storing editorial history information of the data from destination client on the server; and demanding, by the client, the data's destination information stored in the server when the client edits the data, then demanding, by the client, image information representing a final state of an editorial history of the data at the data's destination client as an image on the basis of the data's destination information to confirm matching of the data on the client by displaying said image information on the client.

12. A method for confirming matching of data in a distributed processing system accordion to claim 11, wherein the data of the client is altered on the basis of the editorial history information of the image information of the data at the data's destination client fed to the client.

13. A method for confirming matching of data in a distributed processing system comprising the steps of:

forming a database in a server of a distributed processing system, the database storing data used by a plurality of clients connected to each other and the server through a network;

storing, on the server, destination information for data stored in said database;

receiving and storing editorial history information of the data from destination client on the server; and demanding, by the client, the data's destination information stored in the server when the client edits the data, then demanding, by the client, the data's destination information and the editorial history information of the data at the data's destination client stored in said server if the data's destination client is in a deactivated state when the client demands said editorial history information from the data's destination client on the basis of the data's destination information to confirm matching of the data by the client by displaying said editorial information on the client.

14. A method for confirming matching of data in a distributed processing system according to claim 13, wherein the data of the client is altered on the basis of the editorial history information of the data at the data's destination client fed to the client.

15. A method for confirming matching of data in a distributed processing system comprising the steps of:

forming a database in a server of a distributed processing system, the database storing data used by a plurality of clients connected to each other and the server through a network;

storing, on the server, destination information for data stored in said database;

receiving and storing editorial history information of the data from destination client on the server; and demanding, by the client, the data's destination information and the editorial history information of the data at the data's destination client stored in the server when the client edits the data to confirm matching of the data by the client by displaying the editorial history information on the client.

16. A method for confirming matching of data in a distributed processing system according to claim 15, wherein the data of the client is altered on the basis of the editorial history information of the data at the data's destination client fed to the client.

* * * * *